(12) United States Patent
Zhang et al.

(10) Patent No.: US 8,611,079 B2
(45) Date of Patent: Dec. 17, 2013

(54) DATA CARD

(75) Inventors: Bin Zhang, Shenzhen (CN); Jianjun Xiao, Shenzhen (CN); Menglong Zhao, Shenzhen (CN); Xi Jia, Shenzhen (CN)

(73) Assignee: Huawei Device Co., Ltd., Shenzhen (CN)

( * ) Notice: Subject to any disclaimer, the term of this patent is extended or adjusted under 35 U.S.C. 154(b) by 369 days.

(21) Appl. No.: 13/015,310

(22) Filed: Jan. 27, 2011

(65) Prior Publication Data

US 2011/0182014 A1    Jul. 28, 2011

(30) Foreign Application Priority Data

Jan. 27, 2010   (CN) ...................... 2010 2 0106703 U

(51) Int. Cl.
*G06F 1/16* (2006.01)
*H05K 5/00* (2006.01)
*H05K 7/00* (2006.01)

(52) U.S. Cl.
USPC ................................ 361/679.31; 361/679.32

(58) Field of Classification Search
USPC ................ 361/679.31, 679.32, 679.4–679.45
See application file for complete search history.

(56) References Cited

U.S. PATENT DOCUMENTS

| | | | |
|---|---|---|---|
| D333,784 S * | 3/1993 | Goodman | D3/302 |
| 5,691,882 A * | 11/1997 | Ma | 361/679.32 |
| D413,598 S * | 9/1999 | Cheung | D14/501 |
| 6,184,461 B1 | 2/2001 | Flegel | |
| 6,334,788 B1 * | 1/2002 | Sakaguchi et al. | 439/528 |
| 6,589,069 B1 * | 7/2003 | Liao | 439/501 |
| 6,705,890 B2 * | 3/2004 | Kitou et al. | 439/528 |
| 6,705,891 B1 * | 3/2004 | Lin | 439/528 |
| 6,722,917 B2 * | 4/2004 | Huang | 439/501 |
| 6,774,603 B2 * | 8/2004 | Liao | 320/107 |
| 6,848,802 B2 * | 2/2005 | Chen | 362/85 |
| 7,104,816 B1 * | 9/2006 | Wang | 439/136 |
| 7,121,877 B2 * | 10/2006 | Lin | 439/502 |

(Continued)

FOREIGN PATENT DOCUMENTS

CN    2917096 Y    6/2007
CN    200956696 Y    10/2007

(Continued)

OTHER PUBLICATIONS

International Serach Report, Applicant: Huawei Device Co., Ltd., PCT/CN2011/070636, May 5, 2011, 6 pages.

(Continued)

*Primary Examiner* — Adrian S Wilson
(74) *Attorney, Agent, or Firm* — Slater & Matsil, L.L.P.

(57) ABSTRACT

The utility model provides a data card that includes a circuit board, a holder, an upper cover, a connecting wire, and an interface. The circuit board is fixed in the holder. One end of the flexible connecting wire is connected with the circuit board, and the other end of the flexible connecting wire is connected with the interface. The upper cover covers the holder. When the data card is idle, the interface and the flexible connecting wire are located in the cavity formed by the upper cover and the holder. When the data card is connected with an external device by the interface, the interface is located outside the cavity formed by the upper cover and the holder. The data card enables flexible adjustment of the location of the interface, and fixes the upper cover on the data card when the data card is connected for use.

13 Claims, 10 Drawing Sheets

(56) References Cited

U.S. PATENT DOCUMENTS

| | | | |
|---|---|---|---|
| 7,300,306 B2 * | 11/2007 | Le et al. | 439/502 |
| 7,443,691 B1 * | 10/2008 | Davis | 361/752 |
| D586,347 S * | 2/2009 | Cheng | D14/433 |
| D592,217 S * | 5/2009 | Chen | D14/480.2 |
| 7,578,698 B1 * | 8/2009 | Thia et al. | 439/528 |
| 7,631,983 B2 * | 12/2009 | Chu et al. | 362/154 |
| 7,722,369 B2 * | 5/2010 | Bushby | 439/134 |
| 7,746,029 B2 * | 6/2010 | Toya | 320/107 |
| 7,813,112 B2 * | 10/2010 | Ge et al. | 361/679.01 |
| 8,174,825 B2 * | 5/2012 | Lee et al. | 361/679.37 |
| D665,125 S * | 8/2012 | Cowzer | D27/120 |
| 8,248,812 B2 * | 8/2012 | Xiong | 361/759 |
| 2002/0106933 A1 | 8/2002 | Lee | |
| 2003/0008550 A1 * | 1/2003 | Tse et al. | 439/501 |
| 2006/0027697 A1 * | 2/2006 | Gojanovic et al. | 242/388.1 |
| 2006/0044264 A1 | 3/2006 | Kyouzuka et al. | |
| 2007/0122693 A1 * | 5/2007 | Qin et al. | 429/97 |
| 2007/0141918 A1 * | 6/2007 | Ohta | 439/694 |
| 2008/0227380 A1 | 9/2008 | Hsu et al. | |
| 2008/0286985 A1 | 11/2008 | Huang et al. | |
| 2009/0323270 A1 | 12/2009 | Li | |
| 2010/0055981 A1 * | 3/2010 | Yang | 439/620.21 |
| 2011/0107359 A1 * | 5/2011 | Lee et al. | 720/600 |
| 2011/0170249 A1 * | 7/2011 | Nunes | 361/679.01 |
| 2011/0182014 A1 | 7/2011 | Zhang et al. | |

FOREIGN PATENT DOCUMENTS

| | | |
|---|---|---|
| CN | 101615419 A | 12/2009 |
| CN | 201611702 U | 10/2010 |
| JP | 05-145269 | 6/1993 |
| JP | 11-085393 | 3/1999 |
| JP | 2000-35855 | 2/2000 |
| JP | 2000-001295 | 3/2000 |
| JP | 2002-278696 A | 9/2002 |
| JP | 2003-195980 | 7/2003 |
| JP | 2006-059773 A | 3/2006 |
| JP | 2006-065693 A | 3/2006 |
| JP | 2006-254228 A | 9/2006 |

OTHER PUBLICATIONS

Extended European Search Report, Applicant: Huawei Device Co., Ltd., 11152357.7-1242, Jun. 15, 2011, 6 pages.

Written Opnion of the International Searching Authority received in Patent Cooperation Treaty Application No. PCT/CN2011/070636, mailed May 5, 2011, 5 pages.

Notice of Reasons for Rejection received in Patent Application No. 2011-014980, mailed Oct. 30, 2012, 4 pages.

Argentinian Office Action received in Application No. P 11 01 00272, Applicant: Huawei Device Co., Ltd., mailed Apr. 4, 2013, 4 pages.

Determination of Allowance received in Patent Application No. 2011-014980, mailed Apr. 2, 2013, 4 pages.

* cited by examiner

DATA CARD

This application claims priority to Chinese Patent Application No. 201020106703.X, which was filed Jan. 27, 2010 and is incorporated herein by reference.

TECHNICAL FIELD

The utility model relates to an electronic device, and in particular, to a data card.

BACKGROUND

Currently, data cards (such as for wireless modems) are used widely. In the conventional art, a data card is connected with User Equipment (UE) such as a notebook computer and a personal computer by means of an interface towards the computer and the data card, such as the Universal Serial Bus (USB) interface, EXPRESS interface, and Personal Computer Memory Card International Association (PCMCIA) interface, thus transmitting or processing data between the data card and the UE.

In the conventional art, the interface of the data card is generally welded on the circuit board in the data card, so that the interface is electrically connected with the data processing module on the circuit board. When the data card is idle, the interface may be covered by an interface cover, so the interface is protected from damage; when the data card needs to be connected with the UE, the interface cover is removed and therefore the interface is exposed, so that the interface can be inserted into the interface of the UE and that the data card is connected with the UE.

In the process of implementing the utility model, the inventor finds at least the following problems in the conventional art. The interface of the data card in the conventional art is directly welded on the circuit board, and the location of the interface is not movable according to actual conditions; after the data card is connected with the UE, the interface cover cannot be fixed on the data card, and therefore the interface cover is vulnerable to loss.

SUMMARY OF THE INVENTION

The utility model provides a data card to overcome these problems in the prior art. The interface on the data card is not movable, and the interface cover is vulnerable to loss when the data card is connected. The data card provided herein enables flexible adjustment of the location of the interface, and fixes the interface cover on the data card when the data card is connected.

The utility model provides a data card that includes a circuit board, a holder, an upper cover, a connecting wire, and an interface. The circuit board is fixed on the holder; one end of the connecting wire is connected with the circuit board, and the other end of the connecting wire is connected with the interface; the upper cover covers the holder to form a cavity; and retracting or stretching the connecting wire to enable the interface to locate inside or outside the cavity respectively. In other embodiments, bending or straightening the connecting wire to enable the interface to locate inside or outside the cavity respectively.

On the data card disclosed in the utility model, the interface is connected with the circuit board by means of the connecting wire. Therefore, when the data card is connected with a UE, the location of the interface can be adjusted as required. The part of the data card, for holding the circuit board, will never interfere with the locations of other devices on the UE, and the data card can be connected with the UE by means of the interface conveniently. When the data card is idle, the connecting wire and the interface may be covered by the upper cover, and protected from damage. On the occasion of connecting the data card with the UE, the upper cover may be opened and the interface may be exposed and connected to the UE. The upper cover can cover the holder of the data card. Therefore, the upper cover is not vulnerable to loss when the data card is connected.

BRIEF DESCRIPTION OF THE DRAWINGS

To make the technical solution in the utility model or in the conventional art clearer, the following describes the accompanying drawings for illustrating the embodiments of the utility model or the conventional art. Apparently, the accompanying drawings described below are exemplary only, and persons of ordinary skill in the art can derive other drawings from such accompanying drawings without creative effort.

DETAILED DESCRIPTION OF ILLUSTRATIVE EMBODIMENTS

The following detailed description is provided with reference to the accompanying drawings to provide a thorough understanding of the utility model. Evidently, the drawings and the detailed description are merely representative of particular embodiments of the utility model. All other embodiments, which can be derived by those skilled in the art from the embodiments provided herein without any creative effort, shall fall within the scope of the utility model.

First Embodiment

Figure 1:
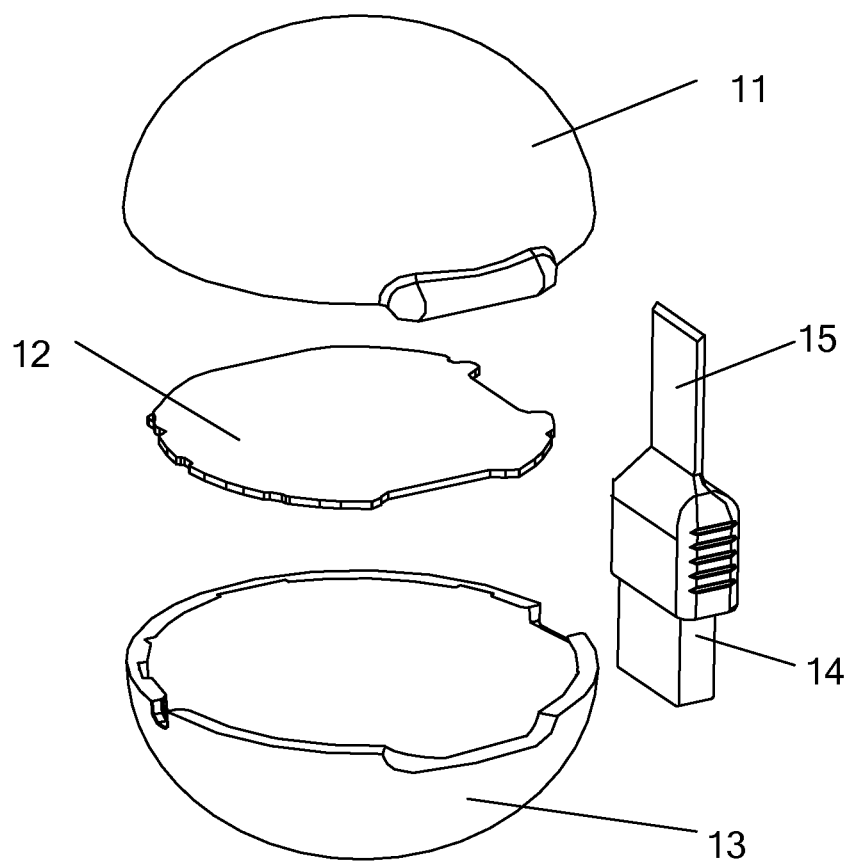
FIG. 1 is an exploded view of a data card in a first embodiment of the utility model.
Figure 2:
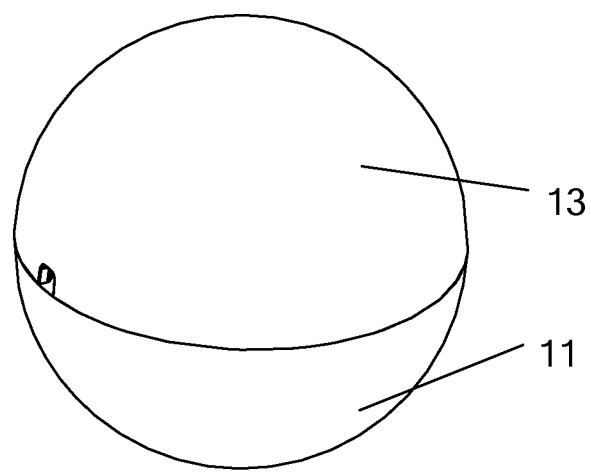
FIG. 2 shows a structure of a data card that is in state 1 in the first embodiment of the utility model.
Figure 3:
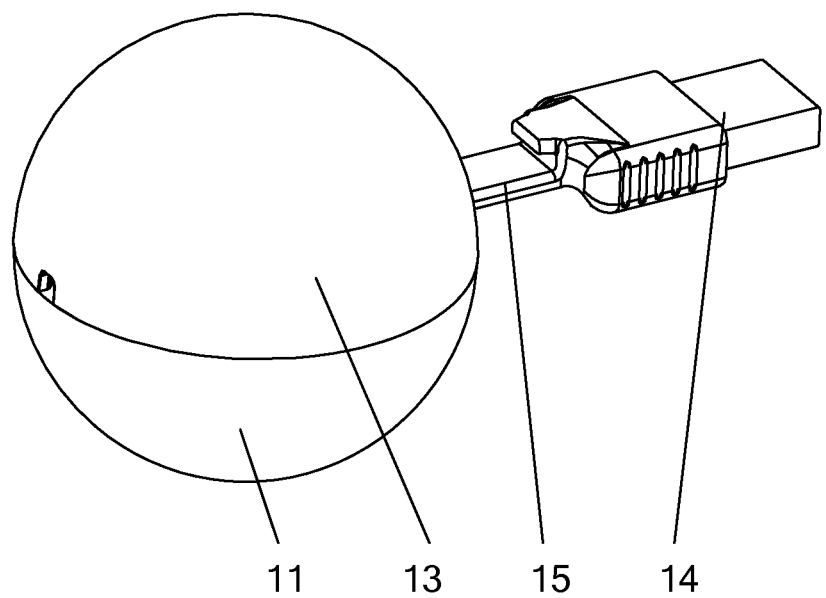
FIG. 3 shows a structure of a data card that is in state 2 in the first embodiment of the utility model.

FIG. 1 is an exploded view of a data card in the first embodiment of the utility model; FIG. 2 shows a structure of a data card that is in state 1 in the first embodiment of the utility model; and FIG. 3 shows a structure of a data card that is in state 2 in the first embodiment of the utility model. As shown in FIG. 1, FIG. 2, and FIG. 3, a data card provided in the first embodiment includes a circuit board 12, a holder 11, an upper cover 13, a connecting wire 15, and an interface 14. The data card in FIG. 1 is exploded from top downward, namely, from the holder 11 to the upper cover 13.

The circuit board 12 is fixed in the holder 11. One end of the connecting wire 15 is connected with the circuit board 12, and the other end of the connecting wire 15 is connected with the interface 14. The upper cover 13 covers the holder 11 to form a cavity. Retracting or stretching the connecting wire 15 enables the interface 14 to locate inside or outside the cavity respectively. In other embodiments, bending or straightening the connecting wire to enable the interface to locate inside or outside the cavity respectively.

Specifically, in this embodiment, the connecting wire 15 and the interface 14 can be placed on the surface of the circuit board 12 which is fixed in the holder 11 by retracting or bending the connecting wire 15, the connecting wire 15 and the interface 14 are contained in the cavity formed by the upper cover 13 and the holder 11. In this way, the interface 14 and the connecting wire 15 are wrapped in the cavity by means of the upper cover 13 and the holder 11. On the occasion of connecting the data card with an external device, the upper cover 13 is opened first, the connecting wire 15 is stretched to take the interface 14 out of the cavity, and then the interface 14 is inserted into a corresponding interface of the external device, thus connecting the data card to the external device. In this case, to prevent the loss of the upper cover 13 due to random placement of the upper cover 13, the upper cover 13 in this embodiment may cover the holder 11 again after the interface 14 is taken out. In this way, the upper cover 13 is fixed on the holder 11 after the data card is connected with the external device, and the loss of the upper cover 13 is avoided. In addition, because the interface 14 is connected with the circuit board 12 by means of a connecting wire 15, after the interface 14 is inserted into the corresponding interface of the external device, the holder 11 in this embodiment may adjust the length of the connecting wire 15 according to the location relation of the components on the external device. Therefore, the data card in this embodiment is set in a proper location, thus preventing unavailability of the data card caused by conflict between the dimensions of the data card and the locations of other components of the external device.

The data card shown in FIG. 1-FIG. 3 is illustrative in nature. The shapes of the components in the data card in this embodiment include but are not limited to the shapes shown in the accompanying drawings. For example, the shape of the data card in this embodiment may be a sphere, a cube, or a dodecahedron.

The data card in this embodiment connects the interface with the circuit board by means of a connecting wire. Therefore, when the data card is connected with the UE, the location between the interface and the circuit board may be adjusted as required; the part of the data card, for holding the circuit board in the data card, will be prevented from interfering with the locations of other devices on the UE, and the data card can be connected with the UE conveniently by means of the interface. When the data card is idle, the connecting wire and the interface may be covered and protected by the upper cover. On the occasion of connecting the data card with the UE, the upper cover may be opened and the interface may be exposed and connected to the UE; and the upper cover can cover the holder of the data card. Therefore, the upper cover is not vulnerable to loss when the data card is connected.

Second Embodiment

Figure 4:
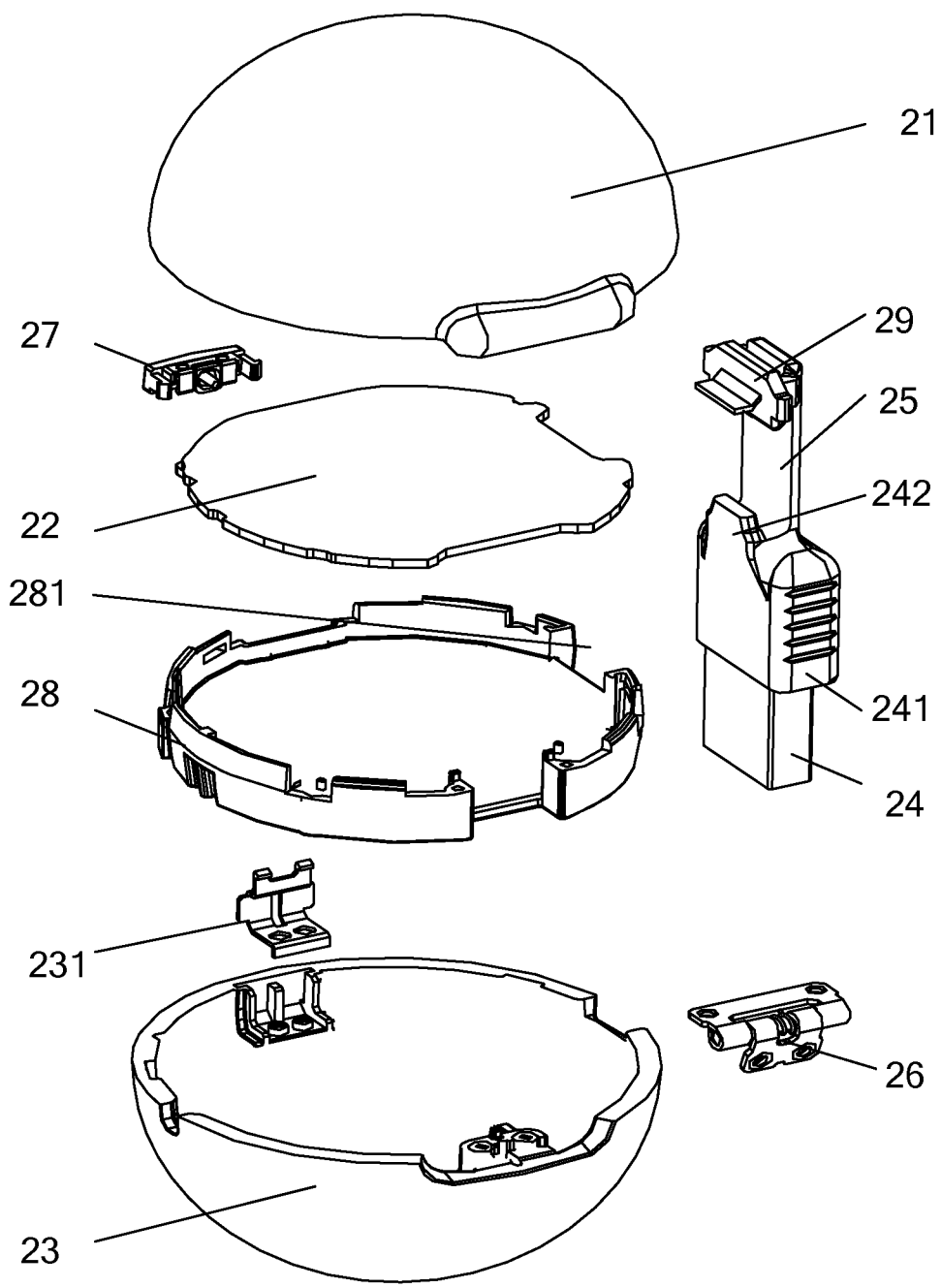
FIG. 4 is an exploded view of a data card in a second embodiment of the utility model.

FIG. 4 is an exploded view of a data card in the second embodiment of the utility model. FIG. 4 shows the second embodiment. The data card in this embodiment is based on the first embodiment, but further includes a shaft unit 26. To connect the upper cover 23 onto the holder 21 conveniently, the data card in this embodiment connects the upper cover 23 with the holder 21 by means of the shaft unit 26. In this way, the upper cover is connected with the holder by means of the shaft unit 26. The structure of the shaft unit 26 is as shown in FIG. 5.

Figure 5:
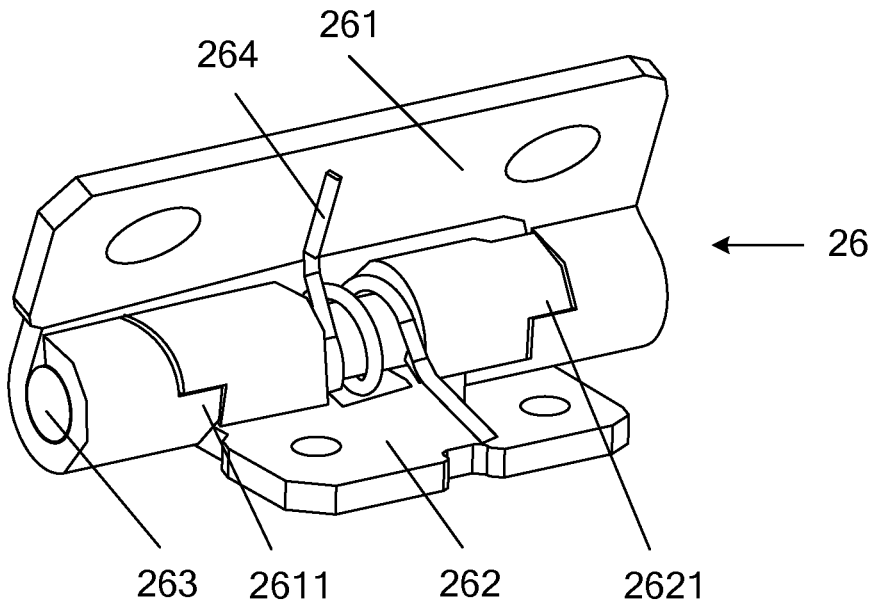
FIG. 5 shows a structure of a shaft unit in a data card in the second embodiment of the utility model.

FIG. 5 shows a structure of a shaft unit in a data card in the second embodiment of the utility model. FIG. 5 shows the structure of the shaft unit 26 in FIG. 4. As shown in FIG. 5, the shaft unit 26 in this embodiment includes a shaft 263, a first connecting plate 261, and a second connecting plate 262. One end of the first connecting plate 261 is hinged to the shaft 263, and the other end of the first connecting plate 261 is fixed on the holder 21; and one end of the second connecting plate 262 is hinged to the shaft 263, and the other end of the second connecting plate 262 is fixed on the upper cover 23.

Specifically, as shown in FIG. 4 and FIG. 5, the upper cover 23 may be connected onto the holder 21 by means of the shaft unit 26, and therefore, the upper cover 23 can revolve around the shaft 263. By enabling the upper cover 23 to revolve around the shaft 263, the upper cover 23 covers the holder 21. In this way, the upper cover 23 rotates as against the holder 21, and the upper cover 23 is not vulnerable to loss. In conclusion, the upper cover 23 is hinged to the holder 21 by means of the shaft unit 26, and therefore, the upper cover 23 is fixed onto the holder 21 firmly. Moreover, the upper cover 23 revolves around the shaft 263 to open or close the upper cover 23, thus facilitating the user operation. The upper cover 23 may be installed onto the holder 21 by means of the shaft unit 26 in the following way. First, the first connecting plate 261 of the shaft unit 26 is fixed onto the holder 21 by means of a bolt, and then the second connecting plate 262 of the shaft unit 26 is fixed to the upper cover 23 by means of a bolt. In this way, the upper cover 23 is hinged onto the holder 21 by means of the shaft unit 26, and the upper cover 23 can revolve around the shaft 263.

A first stop block 2611 may be set at the joint between the first connecting plate 261 and the shaft 263. A second stop block 2621 may be set at the joint between the second connecting plate 262 and the shaft 263. When the upper cover 23 is opened and the upper cover 23 revolves around the shaft 263 to a certain angle, the first stop block 2611 props the second stop block 2621 to stop rotation of the upper cover 23. In this way, the rotation angle of the upper cover 23 is controlled effectively.

In the data card in this embodiment, the location between the interface and the circuit board is movable by means of the connecting wire. Therefore, the part of the data card, for holding the circuit board in the data card, is prevented from interfering with the locations of other devices on the UE. Moreover, the upper cover in this embodiment is hinged onto the holder by means of the shaft unit, so that the upper cover can revolve around the shaft in the shaft unit, and that the upper cover is connected onto the holder more firmly. Further, because the upper cover can revolve around the shaft, the upper cover can be rotated to cover the connecting wire and the interface on the holder conveniently when the data card is idle. When the data card in this embodiment needs to connect with an peripheral device, the upper cover can revolve open and the interface is taken out conveniently. After the interface is taken out, the upper cover can revolve reversely to cover the holder. Therefore, the upper cover is connected with the holder by means of the shaft unit, which facilitates the user to open or close the upper cover.

Based on the foregoing technical solution, optionally, a first lock-up unit 27 may be set on the holder 21 in the data card in this embodiment, as shown in FIG. 4; and a second lock-up unit 231 may be set on the upper cover 23 accordingly. The first lock-up unit 27 is connected with the second lock-up unit 231 after the upper cover 23 covers the holder 21 so that the upper cover 23 is clasped on the holder 21. Specifically, after the upper cover 23 revolves around the shaft 263 to cover the holder 21, in order to fix the upper cover 23 onto the holder 21 firmly and prevent the upper cover 23 from being opened accidentally due to external force, the first lock-up unit 27 is connected with the second lock-up unit 231 on the data card so that the upper cover 23 is fixed onto the holder 21 firmly after the upper cover 23 covers the holder 21. In this embodiment, the first lock-up unit 27 and the second lock-up unit 231 may collaborate with each other in the form of a clasp or belt component. The forms of the first lock-up unit 27 and the second lock-up unit 231 are not limited herein.

Figure 6:
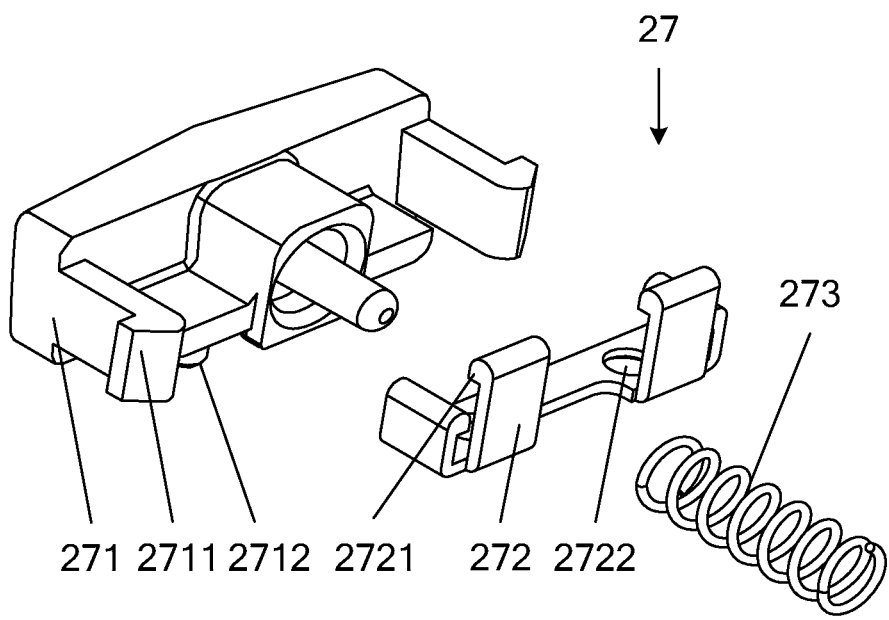
FIG. 6 is an exploded view of a first lock-up unit in a data card in the second embodiment of the utility model.
Figure 7:
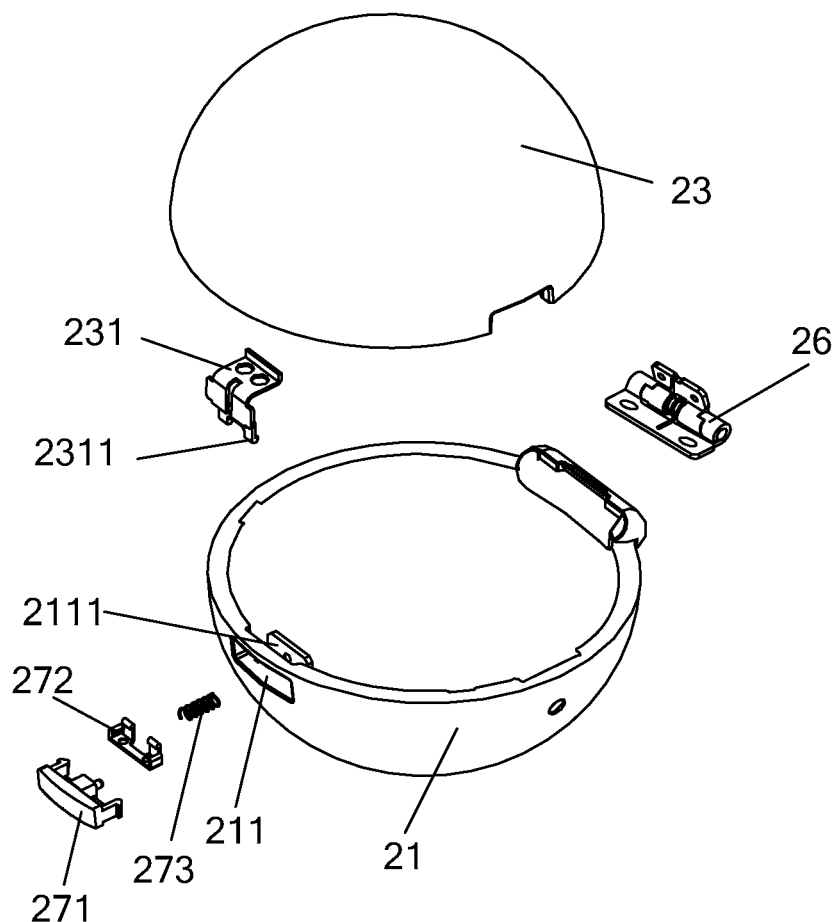
FIG. 7 is a local assembly diagram in a data card in the second embodiment of the utility model.

Further, FIG. 6 is an exploded view of a first lock-up unit in a data card in the second embodiment of the utility model; and FIG. 7 is a local assembly diagram in a data card in the second embodiment of the utility model. As shown in FIG. 6 and FIG. 7, the second lock-up unit 231 in this embodiment may be an upper cover reed. The first lock-up unit 27 is a pushbutton unit, and the pushbutton unit slides in a groove 211 on the holder 21. The pushbutton unit includes a button base 271, a button reed 272, and a spring 273. The button reed 272 is fixed onto the button base 271. One end of the spring 273 is propped against the button base 271, and the other end of the spring 273 is propped against an end of the groove 211. The pushbutton unit is configured to enable a barb of the button reed 272 to be clasped on a barb of the upper cover reed after the upper cover 23 covers the holder 21 so that the upper cover 23 is clasped on the holder 21.

Specifically, the first lock-up unit 27 in this embodiment may be a pushbutton unit, and the second lock-up unit 231 may be an upper cover reed. To install the pushbutton unit onto the holder 21 conveniently, a groove 211 may be set on the holder 21. At the time of assembling the pushbutton unit, the button base 271 is pressed into the groove 211 first. To prevent the button base 271 from sliding out of the groove 211, barbs may be set on the button base 271 symmetrically. In this way, the barbs 2711 on the button base 271 are propped against the inner wall of the holder 21 to prevent the button base 271 from sliding out of the groove 211. Afterward, the mounting hole 2722 on the button reed 272 is put on the positioning pin 2712 at the bottom of the button base 271 so that the button reed 272 is installed on the button base 271. The groove 211 juts out from the end with a barb 2721 on the button reed 272. Finally, the spring 273 is propped against the end of the button base 271 and the end of the groove 211 respectively. For example, a baffle 2111 is set at the end of the groove 211 to fix the position of the spring 273. In addition, the upper cover reed of the second lock-up unit 231 is fixed onto the upper cover 23, and the upper cover 23 juts out from one end of the barb 2311 of the upper cover reed. The barb 2311 on the upper cover reed is clasped to the barb 2721 of the button reed 272 after the upper cover 23 covers the holder 21 so that the upper cover 23 is clasped on the holder 21. On the occasion of opening the upper cover 23, the user presses the button base 271, and the button base 271 overcomes the spring force of the spring 273, and drives the button reed 272 to run toward the baffle 2111 set at the end of the groove 211.

In this way, the barb 2721 of the button reed 272 is disengaged from the barb on the upper cover reed, and the user can open the upper cover 23.

Further, as shown in FIG. 5, the shaft unit 26 in this embodiment may further include a revolving spring 264. The revolving spring 264 is wrapped around the shaft 263. One end of the revolving spring 264 is propped against the first connecting plate 261, and the other end of the revolving spring 264 is propped against the second connecting plate 262. The revolving spring 263 is configured to exert spring force on the first connecting plate 261 and the second connecting plate 262 so that the upper cover 23 opens automatically after the first lock-up unit 27 is disconnected from the second lock-up unit 231. Specifically, the revolving spring 263 in this embodiment may exert spring force on the first connecting plate 261 and the second connecting plate 262 so that the foregoing spring force exists between the upper cover 23 and the holder 21. After the user presses the button base 271, the upper cover reed on the upper cover 23 is disengaged from the button reed 272, and the upper cover 23 opens automatically as a result of the spring force, and the user can use the data card more conveniently.

In the data card in this embodiment, a first lock-up unit is set on the holder, and a second lock-up unit is set on the upper cover accordingly. The first lock-up unit is connected with the second lock-up unit after the upper cover covers the holder, and therefore, the upper cover is fixed onto the holder firmly to prevent the upper cover from opening accidentally as a result of external force. The first lock-up unit is a pushbutton unit, and the second lock-up unit is an upper cover reed. Therefore, the button reed in the pushbutton unit works together with the upper cover reed to implement functions of the first lock-up unit and the second lock-up unit and fix the upper cover onto the holder firmly. In addition, with the revolving spring set on the shaft unit, spring force exists between the upper cover and the holder. After the user presses the button base in the pushbutton unit, the upper cover reed is disengaged from the button reed, and the upper cover opens automatically as a result of the spring force, and the user can use the data card more conveniently.

Based on the foregoing technical solution, the data card in this embodiment may further include a protective shell 28 optionally, as shown in FIG. 4. The protective shell 28 is fixed on the holder 21, and the circuit board 22 is located between the protective shell 28 and the holder 21.

Figure 8A:
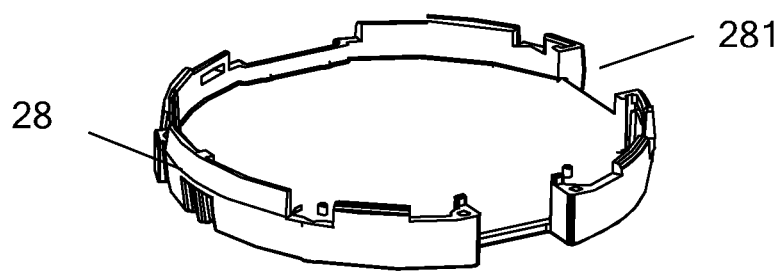
FIG. 8a is a first schematic diagram of a protective shell in a data card in the second embodiment of the utility model.
Figure 8B:
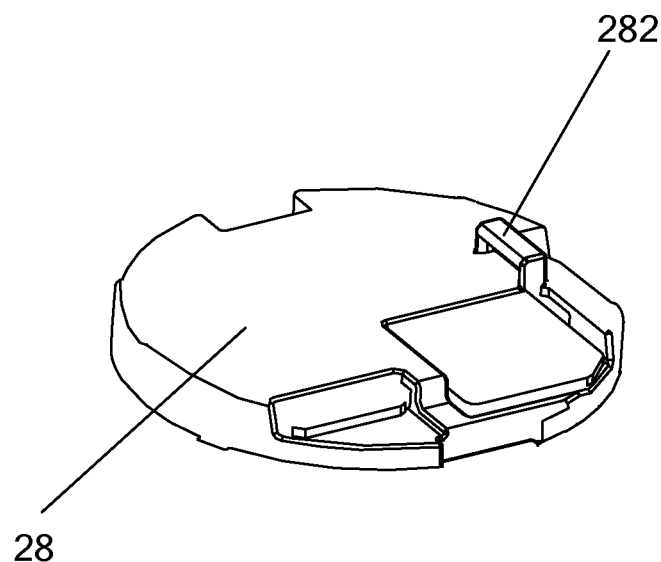
FIG. 8b is a second schematic diagram of a protective shell in a data card in the second embodiment of the utility model.

Specifically, as shown in FIG. 8*a* and FIG. 8*b*, the protective shell 28 in this embodiment may have a hemmed disk structure. The protective shell 28 in this embodiment encloses the circuit board 22 in the holder 21 so that the circuit board 22 is protected by the protective shell 28 from external objects. A hole (not illustrated herein) may be set on the protective shell 28, so that the connecting wire 25 can be connected with the circuit board 22. The connecting wire 25 runs by means of the hole to get connected with the circuit board 22. Moreover, by means of the protective shell 28, when the interface 24 and the connecting wire 25 need to be placed in the cavity formed by the upper cover 23 and the holder 21, the interface 24 and the connecting wire 25 may be placed on the protective shell 28. In this way, the circuit board 22 is isolated from the interface 24 and the connecting wire 25 to prevent the interface 24 and the connecting wire 25 from damaging the electrical components on the circuit board 22. The circuit board 22 in this embodiment may be fixed onto the protective shell 28 first, and then the protective shell 28 is fixed along with the circuit board 22 onto the holder 21.

Alternatively, the circuit board 22 is fixed onto the holder 21 first, and then the protective shell 28 is fixed onto the holder 21.

Further, as shown in FIG. 4, a connecting wire fastener 29 may be set in a position which is on the connecting wire 25 and far away from the interface 24, and the connecting wire fastener is fastened on the protective shell 28. Specifically, to fix the end connected with the circuit board 22 on the connecting wire 25 onto the protective shell 28 firmly and prevent the joint between the connecting wire 25 and the circuit board 22 from becoming loose as a result of frequent retraction of the connecting wire 25 in the long period of using the data card, a connecting wire fastener 29 is set on the connecting wire 25. The connecting wire fastener 29 is fastened on the protective shell 28 after the connecting wire 25 is connected with the circuit board 22. As shown in FIG. 8a, the connecting wire fastener 29 may be inserted into the slot 281 on a lower surface of the protective shell 28, or the connecting wire fastener 29 is hinged to the protective shell 28 or fixed on the protective shell 28. In this way, the joint between the connecting wire 25 and the circuit board 22 is prevented from receiving too large tensile force.

Further, as shown in FIG. 4 and FIG. 8b, a third lock-up unit 242 is set on the shell 241 of the interface 24, and a fourth lock-up unit 282 is set on the upper surface of the protective shell 28. The third lock-up unit 242 is connected with the fourth lock-up unit 282 to fix the interface 24 on the protective shell 28. Specifically, to fix the interface 24 onto the protective shell 28 after the interface 24 is placed on the protective shell 28, and to enable the upper cover 23 to cover the holder 21 conveniently, the third lock-up unit 242 on the interface 24 is connected with the fourth lock-up unit 282 on the protective shell 28 to fix the interface 24 on the protective shell 28 firmly. The third lock-up unit 242 and the fourth lock-up unit 282 may collaborate with each other in the form of a clasp or belt component. The forms of the third lock-up unit 242 and the fourth lock-up unit 282 are not limited herein. For example, to implement the functions of the third lock-up unit 242 and the fourth lock-up unit 282 conveniently, the third lock-up unit 242 may be a fixing hook, and the fixing hook is fixed on the shell 241; the fourth lock-up unit 282 may be a fixing ring, and the fixing ring is fixed on the upper surface of the protective shell 28. The fixing hook is inserted into the fixing ring to fix the interface 24 onto the protective shell 28. The detailed usage is: The fixing hook on the interface 24 is inserted into the fixing ring on the protective shell 28 directly, and the fixing hook is clasped to the fixing ring so that the interface 24 can be fixed onto the protective shell 28. By taking the fixing hook out of the fixing ring, the user can remove the interface 24 from the protective shell 28.

The connecting wire 25 in the data card in this embodiment may be a flexible connecting wire. The flexible connecting wire may have a spring structure; or the flexible connecting wire may include a first flexible connecting wire, a swivel base, and a second flexible connecting wire, which are concatenated. The first flexible connecting wire is electrically connected with the second flexible connecting wire; and the second flexible connecting wire revolves around the swivel base as against the first flexible connecting wire. The material of the flexible connecting wire may be but is not limited to bendy and retractable flexible material commonly used in the industry, for example, flexible plastic.

Figure 9A:
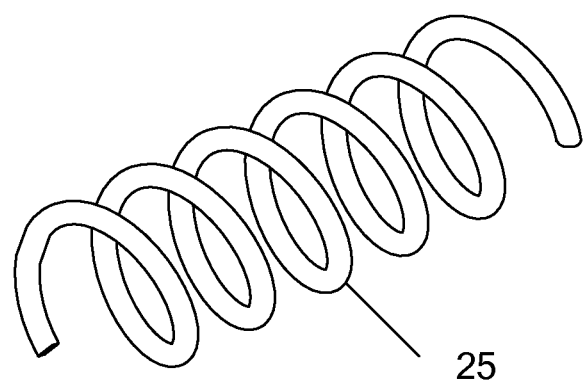
FIG. 9a is a first schematic diagram of a connecting wire in a data card in the second embodiment of the utility model.
Figure 9B:
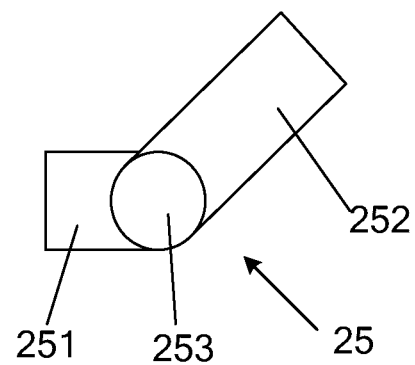
FIG. 9b is a second schematic diagram of a connecting wire in a data card in the second embodiment of the utility model.

FIG. 9a is a first schematic diagram of a connecting wire in a data card in the second embodiment of the utility model. As shown in FIG. 9a, the connecting wire 25 in this embodiment is a flexible connecting wire of a spring structure, which makes it easier to install the data card onto a narrow external device. For example, the user may pull the connecting wire 25 and insert the interface 24 into the external device, and the main body such as the holder 21 of the data card may be placed onto a broader position. FIG. 9b is a second schematic diagram of a connecting wire in a data card in the second embodiment of the utility model. As shown in FIG. 9b, the connecting wire 25 in this embodiment may be a revolving flexible connecting wire, and may include a first flexible connecting wire 251, a swivel base 253, and a second flexible connecting wire 252, which are concatenated. The first flexible connecting wire 251 is electrically connected with the second flexible connecting wire 252; or the first flexible connecting wire 251 and the second flexible connecting wire 252 may be the same conductor. The first flexible connecting wire 251 is connected with the circuit board 22; the second flexible connecting wire 252 is connected with the interface 24; and the second flexible connecting wire 252 revolves around the swivel base 253 as against the first flexible connecting wire 251. Therefore, the user can rotate the connecting wire 25 to stretch or retract the interface 24.

The protective shell in this embodiment encloses the circuit board in the holder 21 so that the circuit board is protected against external objects. Moreover, the protective shell isolates the interface from the circuit board to prevent the interface from damaging the circuit board. The connecting wire fastener is fixed on the connecting wire and set on the protective shell to protect the joint between the connecting wire and the circuit board. In this way, the joint between the connecting wire and the circuit board is prevented from receiving too large tensile force in the use process, and the connecting wire is connected with the circuit board firmly. The third lock-up unit is connected with the fourth lock-up unit to fix the interface on the protective shell and facilitate the upper cover to cover the holder. The connecting wire is a retractable or revolving flexible connecting wire, which makes it easier to install the data card onto a narrow external device and makes the data card more widely applicable.

It should be noted that the interface mentioned in any embodiment above may be but is not limited to the PCMCIA interface, USB interface, EXPRESS interface, or Compact Flash (CF) interface. The data card in the utility model may be a spherical data card. For example, the football-like data card, basketball-like data card, or sphere-like data card. The shape of the data card may be a cube or any other cubic structure. The shape of the data card is not limited herein.

The following describes the data card in different states with reference to the accompanying drawings.

Figure 10:
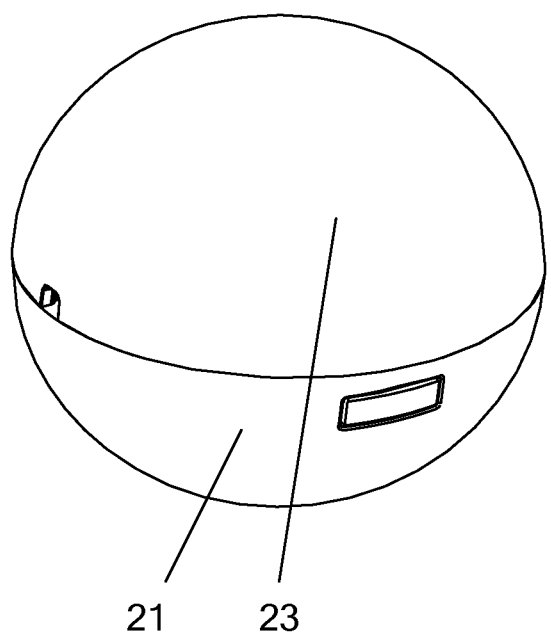
FIG. 10 shows a structure of a data card that is in the closed state in the second embodiment of the utility model.
Figure 11:
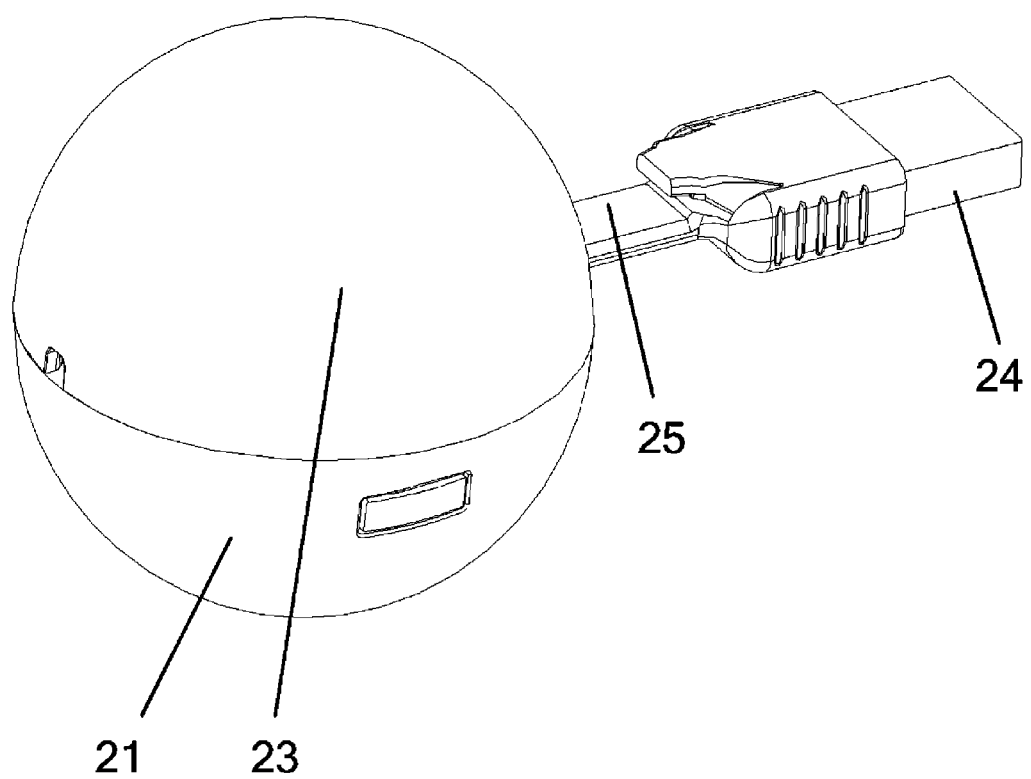
FIG. 11 shows a structure of a data card that is in the open state in the second embodiment of the utility model.
Figure 12:
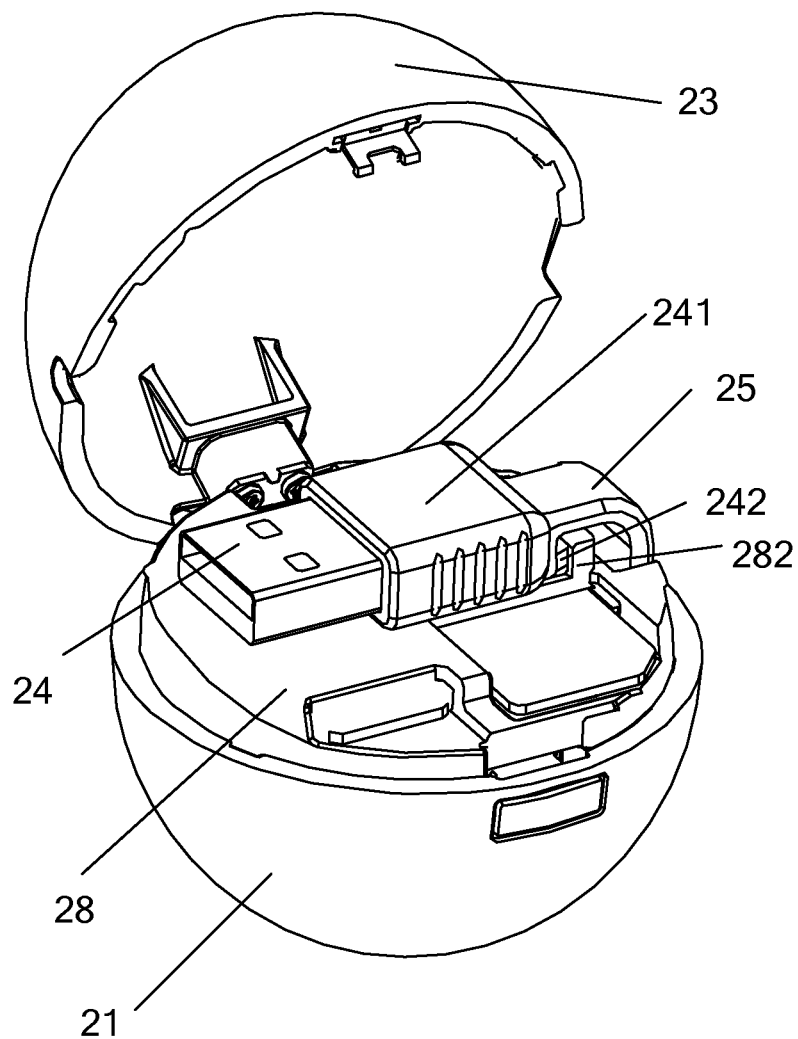
FIG. 12 shows a structure of the data card illustrated in FIG. 10 when the upper cover is in the open state.
Figure 13:
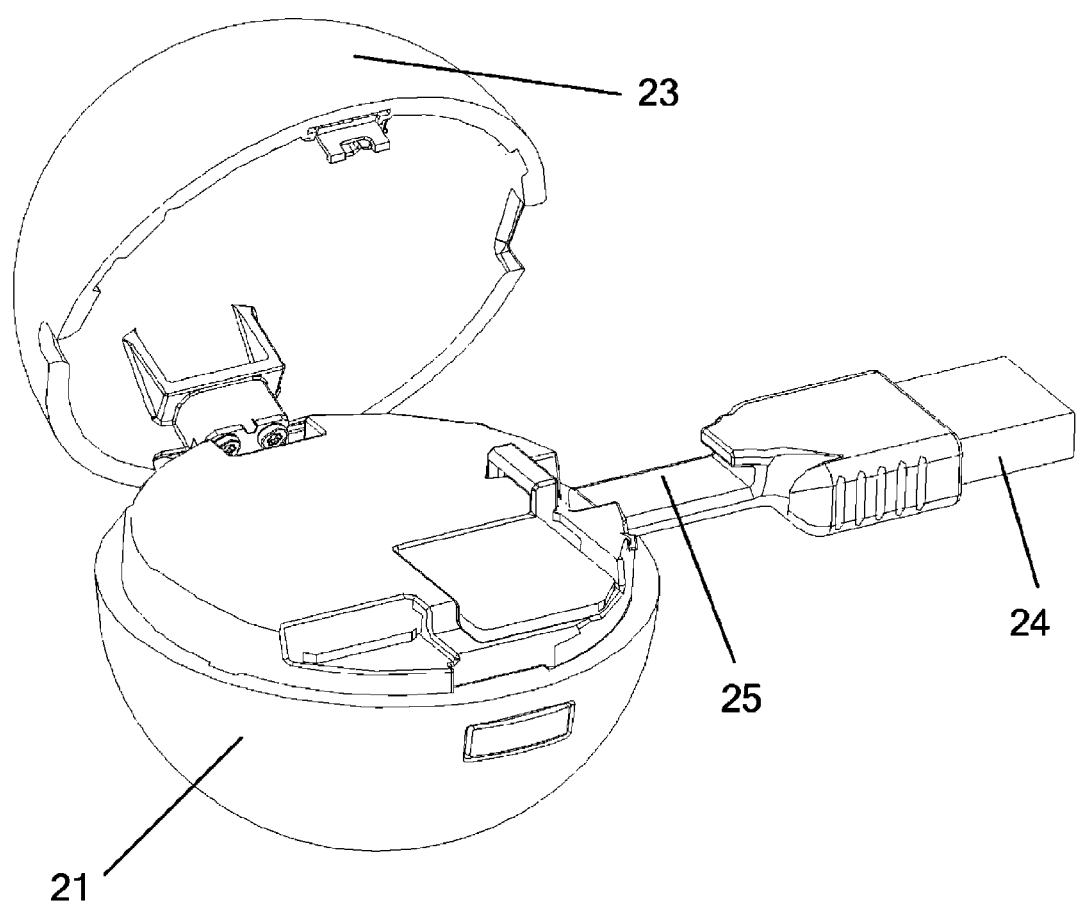
FIG. 13 shows a structure of the data card illustrated in FIG. 11 when the upper cover is in the open state.

FIG. 10 shows a structure of a data card that is in the closed state in the second embodiment of the utility model. As shown in FIG. 10, the upper cover 23 covers the holder 21, and the data card is closed. FIG. 11 shows a structure of a data card that is in the open state in the second embodiment of the utility model. As shown in FIG. 11, the upper cover 23 in this embodiment also covers the holder 21, but the interface 24 juts out from the cavity formed by the upper cover 23 and the holder 21 by means of the flexible connecting wire 25. FIG. 12 shows a structure of the data card illustrated in FIG. 10 when the upper cover is in the open state. As shown in FIG. 12, the upper cover 23 revolves open around the holder 21. By retracting or bending the flexible connecting wire 25, the interface 24 is placed on the protective shell 28, and the third lock-up unit 242 is connected with the fourth lock-up unit 282 to fix the interface 24 on the protective shell 28 firmly. FIG. 13 shows a structure of the data card illustrated in FIG. 11 when the upper cover is in the open state. As shown in FIG. 13, the upper cover 23 revolves open around the holder 21. By means of stretch of the flexible connecting wire 25, the interface 24 juts out from the cavity formed by the upper cover 23 and the holder 21 to facilitate connection with the external device.

Finally, it should be noted that the above embodiments are merely provided for describing the technical solutions of the utility model, but not intended to limit the utility model. It is apparent that persons skilled in the art can make various modifications and variations to the utility model without departing from the spirit and scope of the utility model. The utility model is intended to cover the modifications and variations provided that they fall within the scope of protection defined by the following claims or their equivalents.

What is claimed is:

1. A data card, comprising:
a circuit board;
a holder;
an upper cover that covers the holder to form a cavity;
an interface;
a connecting wire, a first end of the connecting wire being connected with the circuit board, and a second end of the connecting wire being connected with the interface, wherein bending or straightening the connecting wire enables the interface to be located inside or outside the cavity respectively; and
a protective shell fixed on the holder, wherein the circuit board is fixed on the protective shell; wherein the connecting wire comprises a flexible connecting wire;
wherein the connecting wire comprises a first flexible connecting wire, a swivel base, and a second flexible connecting wire, which are concatenated, the first flexible connecting wire being electrically connected with the second flexible connecting wire, wherein the second flexible connecting wire revolves around the swivel base as against the first flexible connecting wire.

2. The data card according to claim 1, further comprising a shaft unit, by which the upper cover is rotated and connected with the holder.

3. The data card according to claim 2, wherein:
the shaft unit comprises a shaft, a first connecting plate and a second connecting plate;
a first end of the first connecting plate is hinged to the shaft, and a second end of the first connecting plate is fixed on the holder; and
a first end of the second connecting plate is hinged to the shaft, and a second end of the second connecting plate is fixed on the upper cover.

4. The data card according to claim 1, further comprising a first lock-up unit set on the holder, and a corresponding second lock-up unit set on the upper cover, wherein the first lock-up unit is connected with the second lock-up unit to enable the upper cover to be clasped on the holder.

5. The data card according to claim 2, further comprising a first lock-up unit set on the holder and a corresponding second lock-up unit set on the upper cover, wherein the first lock-up unit is connected with the second lock-up unit to enable the upper cover to be clasped on the holder.

6. The data card according to claim 5, wherein:
the second lock-up unit is an upper cover reed; and
the first lock-up unit is a pushbutton unit that slides in a groove on the holder.

7. The data card according to claim 6, wherein:
the pushbutton unit comprises a button base, a button reed, and a spring;
the button reed is fixed on the button base, one end of the spring is propped against the button base, and the other end of the spring is propped against an end of the groove; and
the pushbutton unit is configured to enable a barb of the button reed to be clasped on a barb of the upper cover reed after the upper cover covers the holder to enable the upper cover to be clasped on the holder.

8. The data card according to claim 3, wherein the shaft unit comprises a revolving spring set around the shaft, one end of the revolving spring is propped against the first connecting plate, and the other end of the revolving spring is propped against the second connecting plate.

9. The data card according to claim 4, wherein the revolving spring is configured to exert spring force on the first connecting plate and the second connecting plate to enable the upper cover to open automatically after the first lock-up unit is disconnected from the second lock-up unit.

10. The data card according to claim 1, further comprising a connecting wire fastener set in a position away from the interface on the connecting wire, wherein the connecting wire fastener is sheathed in the protective shell to enable the connecting wire to be fixed on the protective shell.

11. The data card according to claim 1, further comprising a third lock-up unit set on a shell of the interface and a fourth lock-up unit set on the protective shell, wherein the third lock-up unit is connected with the fourth lock-up unit to fix the interface on the protective shell.

12. The data card according to claim 11, wherein:
the third lock-up unit comprises a fixing hook that is fixed on the shell;
the fourth lock-up unit comprises a fixing ring that is fixed on an upper surface of the protective shell; and
the fixing hook is inserted into the fixing ring to fix the interface on the protective shell.

13. The data card according to claim 1, wherein the data card comprises a spherical data card.

* * * * *